(12) United States Patent
Chen et al.

(10) Patent No.: US 11,658,170 B2
(45) Date of Patent: May 23, 2023

(54) SEMICONDUCTOR PACKAGE STRUCTURE AND METHODS OF MANUFACTURING THE SAME

(71) Applicant: Advanced Semiconductor Engineering, Inc., Kaohsiung (TW)

(72) Inventors: Wei Tsung Chen, Kaohsiung (TW); Li-Hua Tai, Kaohsiung (TW); Paofa Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/214,550

(22) Filed: Mar. 26, 2021

(65) Prior Publication Data
US 2022/0310576 A1    Sep. 29, 2022

(51) Int. Cl.
| | | |
|---|---|---|
| *H01L 25/18* | (2023.01) | |
| *H01L 23/31* | (2006.01) | |
| *H01L 23/04* | (2006.01) | |
| *H01L 23/00* | (2006.01) | |
| *H01L 21/56* | (2006.01) | |

(52) U.S. Cl.
CPC .............. *H01L 25/18* (2013.01); *H01L 21/56* (2013.01); *H01L 23/041* (2013.01); *H01L 23/3121* (2013.01); *H01L 24/32* (2013.01); *H01L 24/33* (2013.01); *H01L 24/48* (2013.01); *H01L 2224/32059* (2013.01); *H01L 2224/32145* (2013.01); *H01L 2224/3303* (2013.01); *H01L 2224/33051* (2013.01); *H01L 2224/48221* (2013.01)

(58) Field of Classification Search
None
See application file for complete search history.

(56) References Cited

U.S. PATENT DOCUMENTS

2019/0109114 A1 *    4/2019    Patten ..................... H01L 24/09

* cited by examiner

*Primary Examiner* — Yu-Hsi D Sun
(74) *Attorney, Agent, or Firm* — Foley & Lardner LLP

(57) ABSTRACT

The present disclosure provides a semiconductor package structure and a method of manufacturing the same. The semiconductor package structure includes a substrate, a first electronic component, an interlayer, a third electronic component and an encapsulant. The first electronic component is disposed on the substrate. The first electronic component has an upper surface and a lateral surface and a first edge between the upper surface and the lateral surface. The interlayer is on the upper surface of the first electronic component. The third electronic component is attached to the upper surface of the first electronic component via the interlayer. The encapsulant encapsulates the first electronic component and the interlayer. The interlayer does not contact the lateral surface of the first electronic component.

13 Claims, 20 Drawing Sheets

SEMICONDUCTOR PACKAGE STRUCTURE AND METHODS OF MANUFACTURING THE SAME

BACKGROUND

1. Field of the Disclosure

The present disclosure relates to semiconductor package structure and methods of manufacturing the same.

2. Description of Related Art

To address a trend towards miniaturization and increased functionality, a semiconductor package may integrate multiple electronic components within the package, and the electronic components may be stacked with each other for miniaturization. In the case where an electronic component is disposed on a plurality of electronic components arranged side-by-side, it is desirable to enhance the adhesion among the components, especially when the side-by-side arranged components have different thicknesses.

SUMMARY

According to some embodiments of the present disclosure, a semiconductor package structure includes a substrate, a first electronic component, an interlayer, a third electronic component and an encapsulant. The first electronic component is disposed on the substrate. The first electronic component has an upper surface and a lateral surface and a first edge between the upper surface and the lateral surface. The interlayer is on the upper surface of the first electronic component. The third electronic component is attached to the upper surface of the first electronic component via the interlayer. The encapsulant encapsulates the first electronic component and the interlayer. The interlayer does not contact the lateral surface of the first electronic component.

According to some embodiments of the present disclosure, a semiconductor package structure includes a substrate, a first electronic component, a third electronic component and an encapsulant. The first electronic component is disposed on the substrate. The third electronic component is attached to an upper surface of the first electronic component via an interlayer. The encapsulant encapsulates the first electronic component and the interlayer. The upper surface of the first electronic component has a first edge away from the second electronic component. The upper surface of the second electronic component has a first edge away from the first electronic component. The interlayer does not extend beyond the first edge of the upper surface of the first electronic component and the first edge of the upper surface of the second electronic component.

According to some embodiments of the present disclosure, a method of manufacturing a semiconductor package structure includes: (a) disposing a first electronic component on a substrate; and (b) attaching a third electronic component on an upper surface of the first electronic component via an interlayer, wherein the interlayer does not contact a lateral surface of the first electronic component.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1A:
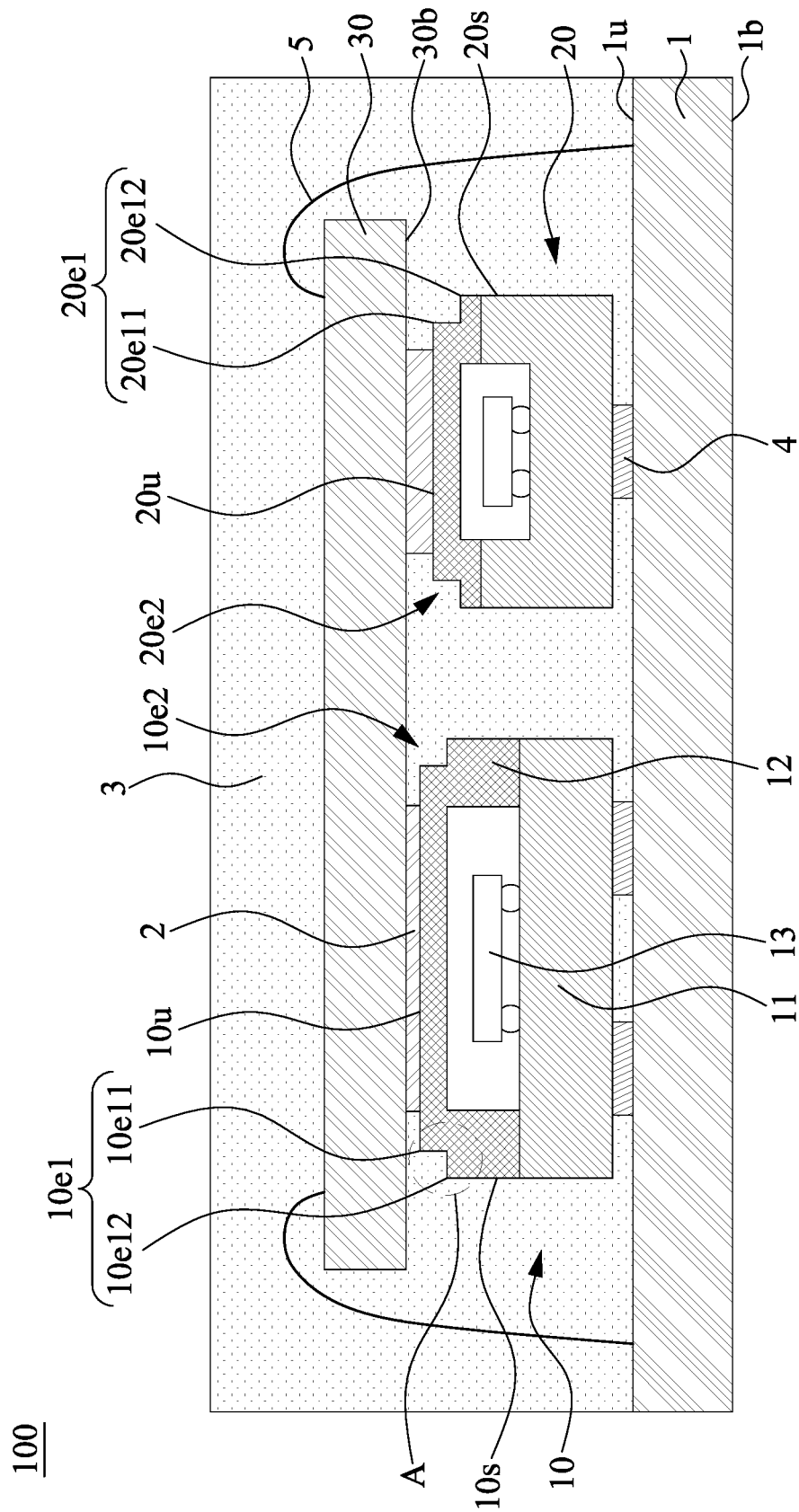
FIG. 1A illustrates a three-dimensional view of a semiconductor package structure according to some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a three-dimensional view of a semiconductor package structure 100 according to some embodiments of the present disclosure. The semiconductor package structure 100 may include a substrate 1, a first electronic component 10, an interlayer 2 and a third electronic component 30. In some embodiments, the semiconductor package structure 100 may further include the second electronic component 20 as illustrated in FIG. 1.

The substrate 1 has an upper surface 1*u* and a lower surface 1*b* opposite to the upper surface 1*u*. The substrate 1 may include traces, pads or interconnections (not shown) for electrical connection.

As illustrated in FIG. 1, the first electronic component 10 and the second electronic component 20 are disposed on the upper surface 1*u* of the substrate 1. The first electronic component 10 and the second electronic component 20 are arranged side-by-side on the substrate 1. The first electronic component 10 has an upper surface 10*u* and a lateral surface 10*s*. The second electronic component 20 has an upper surface 20*u* and a lateral surface 20*s*. In some embodiments, the first electronic component 10, the second electronic component 20 or both may be electrically connected to the substrate 1 via a conductive element 4, such as a wire or bump. In some embodiments, the first electronic component 10, the second electronic component 20 or both may be bonded to the substrate 1 via a bump.

The first electronic component 10 and the second electronic component 20 can be any suitable electronic components. The first electronic component 10 and the second electronic component 20 may include, for example, but is not limited to: a sensing component, a MEMS device, a pressure sensor and a microphone, a processor, a controller (e.g. a memory controller), a microcontroller (MCU), a memory die, a power device, a high speed input/output device or other electronic component(s). In some embodiments, the first electronic component 10 or the second electronic component 20 may be a MEMS device.

The first electronic component 10 and the second electronic component 20 may have different thickness. In some embodiments, the upper surface 10*u* of the first electronic component 10 is not coplanar with the upper surface 20*u* of the second electronic component 20. In some embodiments, the upper surface 10*u* of the first electronic component 10 is at a higher elevation than the upper surface 20*u* of the second electronic component 20. In some embodiments, a distance between the upper surface 10*u* of the first electronic component 10 and the upper surface 20*u* of the second electronic component 20 is 100 μm or less (e.g., 100 μm, 90 μm, 80 μm, 70 μm, 60 μm, 50 μm, 40 μm or less).

In some embodiments, the first electronic component 10 may have an edge (e.g., 10*e*1, 10*e*2) between the upper surface 10*u* and the lateral surface 10*s*. The edge 10*e*1 is away from the second electronic component 20. The edge 10*e*2 is opposite to the edge 10*e*1 and adjacent to the second electronic component 20. In some embodiments, the second electronic component 20 may have an edge (e.g., 20*e*1, 20*e*2) between the upper surface 20*u* and the lateral surface 20*s*. The edge 20*e*1 is away from the first electronic component 10. The edge 20*e*2 is opposite to the edge 20*e*1 and adjacent to the first electronic component 10. The edges (e.g., 10*e*1, 10*e*2, 20*e*1 and 20*e*2) of the first electronic component 10 and/or the second electronic component 20 may be recessed. The recessed edge may include a first sub-edge connected to the upper surface and a second sub-edge connected to the lateral surface of the corresponding electronic component. For example, as illustrated in FIG. 1A, the edge 10*e*1 may include a first sub-edge 10*e*11 connected to the upper surface 10*u* and a second sub-edge 10*e*12 connected to the lateral surface 10*s*, and the edge 20*e*1 may include a first sub-edge 20*e*11 connected to the upper surface 20*u* and a second sub-edge 20*e*12 connected to the lateral surface 20*s*. In the present disclosure, the edge 10*e*1 and the edge 10*e*2 may be referred to as the first edge and the second edge of the first electronic component 10, respectively, and the edge 20*e*1 and the edge 20*e*2 may be referred to as the first edge and the second edge of the second electronic component 20, respectively.

Figure 1B:
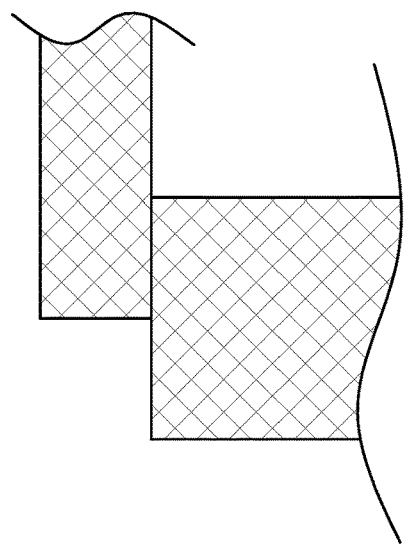
FIG. 1B is an enlarged view of a section A of FIG. 1A according to some embodiments of the present disclosure.
Figure 1C:
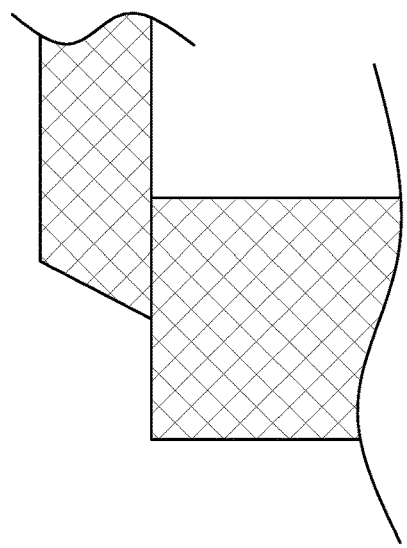
FIG. 1C is an enlarged view of a section A of FIG. 1A according to some embodiments of the present disclosure.
Figure 1D:
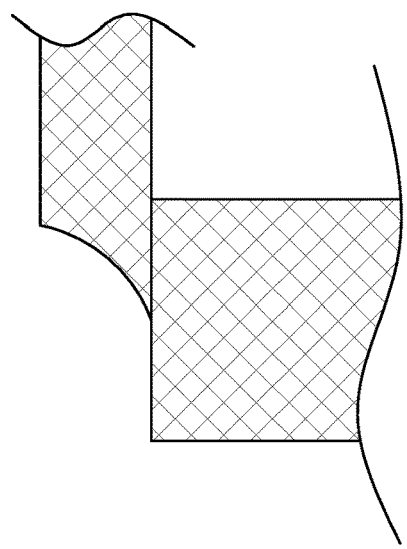
FIG. 1D is an enlarged view of a section A of FIG. 1A according to some embodiments of the present disclosure.

The recessed edge may have any suitable shape. FIG. 1B, FIG. 1C and FIG. 1D are an enlarged view of a section A of FIG. 1A according to some embodiments of the present disclosure. As illustrated in FIG. 1B, FIG. 1C and FIG. 1D, the edge may be stepped, beveled or coved respectively.

Referring back to FIG. 1A, the first electronic component 10 or the second electronic component 20 may include a base 11, one or more component 13 and a lid 12. The base 11 may be a substrate and includes traces, pads or interconnections (not shown) for electrical connection. The one or more component 13 may be disclosed on the base 11 and include crystal, active components (e.g., die) or passive components (e.g., resistor, capacitor). The one or more component 13 may be electrically connected to the base 11. The lid 12 is disposed on the base 11 and defines, together with base 11, a cavity to accommodate the one or more component 13. In some embodiments, the lid 12 encloses the one or more component 13. In some embodiments, the lid 12 is a metal lid. The lid 12 may include, for example, cobalt, aluminum, copper, chromium, tin, gold, silver, nickel, iron, or stainless steel, or a mixture, an alloy, or other combination thereof. In some embodiments, the base 11 may include peripheral walls and the lid 12 is disposed on a top of the peripheral walls. Although the edges 10*e*1, 10*e*2, 20*e*1 and 20*e*2 are defined by the lid 12 in the embodiments of FIG. 1A, the edges 10*e*1, 10*e*2, 20*e*1 and 20*e*2 may be defined by the lid 12 and the peripheral walls of the base 11 in some other embodiments.

The third electronic component 30 can be any suitable electronic components. The third electronic component 30 may include, for example, but is not limited to, an active component, e.g., a processor component, a switch component, an application specific IC (ASIC) or another active component. In some embodiments, the third electronic component 30 may be electrically connected to the substrate 1, e.g., via a wire 5.

The interlayer 2 may be an adhesive layer and can be made of any suitable adhesive. In some embodiment, the adhesive may include a binder resin, for example, an epoxy-based resin, a polyimide-based resin, a polyacrylate-based resin, a polyurethane-based resin or a silicone-based resin. In some embodiment, the interlayer is made of an underfill material or a mold underfill material (MUF). In some embodiment, the interlayer is non-conductive. In some embodiments, the interlayer can be made of a material having a good adhesion to the lid 12.

The third electronic component 30 is disposed over the first electronic component 10 and the second electronic component 20. In some embodiments, the third electronic component 30 is attached to the upper surface 10*u* of the first electronic component 10 and the upper surface 20*u* of the second electronic component 20 via the interlayer 2. The interlayer 2 is disposed on the upper surface 10*u* of the first electronic component 10 and the upper surface 20*u* of the second electronic component 20 and contacts the lower surface 30b of the third electronic component 30, the upper surface 10u of the first electronic component 10 and the upper surface 20u of the second electronic component 20. In some embodiments, the interlayer 2 may be disposed on the upper surface 10u of the first electronic component 10 and the upper surface 20u of the second electronic component 20, separately.

In some embodiments, the interlayer 2 does not contact the lateral surface 10s of the first electronic component 10 and does not contact the lateral surface 20s of the second electronic component 20. Thus, the lateral surface 10s of the first electronic component 10 and the lateral surface 20s of the second electronic component 20 are in contact with the encapsulant 3, rather than the interlayer 2. In some embodiments, the lateral surface 10s of the first electronic component 10 and the lateral surface 20s of the second electronic component 20 may be free of the interlayer 2.

In some embodiments, the interlayer 2 may be disposed on the edge (e.g., 10e1, 20e1) but does not contact the second sub-edge (e.g., 10e12, 20e12) connected to the lateral surface (e.g., 10s, 20s) of the first electronic component 10 or the second electronic component 20. In some further embodiments, the interlayer 2 does not contact the first sub-edge (e.g., 10e11, 20e11) connected to the upper surface (e.g., 10u, 20u) of the first electronic component 10 or the second electronic component 20.

The interlayer 2 may extend over the upper surface 10u of the first electronic component 10 and the upper surface 20u of the second electronic component 20. In some embodiments, the interlayer 2 may contact the first edge 10e1 of the upper surface 10u of the first electronic component 10, but does not extend beyond the first edge 10e1 of the upper surface 10u of the first electronic component 10. In some embodiments, the interlayer 2 may contact the first edge 20e1 of the upper surface 20u of the second electronic component 20, but does not extend beyond the first edge 20e1 of the upper surface 20u of the second electronic component 20. In some embodiments, the interlayer 2 may have an end spaced from the first edge 10e1 of the upper surface 10u of the first electronic component 10. In some embodiments, the interlayer 2 may have an end spaced from the first edge 20e1 of the upper surface 20u of the second electronic component 20. In some embodiments, the interlayer 2 may be disposed on the upper surface 10u of the first electronic component 10 and spaced from all of the peripheral edges of the upper surface 10u of the first electronic component 10. In some embodiments, the interlayer 2 may be disposed on the upper surface 20u of the second electronic component 20 and spaced from all of the peripheral edges of the upper surface 20u of the second electronic component 20.

In some embodiments, the interlayer 2 does not contact a lateral surface of the third electronic component 30.

The semiconductor package structure 100 may further include an encapsulant 3. The encapsulant 3 is disposed on an upper surface 1u of the substrate 1 and covers the first electronic component 10, the second electronic component 20, the third electronic component 30. In some embodiments, the encapsulant 3 contacts the lateral surface 10s of the first electronic component 10 and the lateral surface 20s of the second electronic component 20.

The encapsulant 3 may include a molding compound, such as a Novolac-based resin, an epoxy-based resin, a silicone-based resin, or other another suitable encapsulant. Fillers, such as silicon oxide fillers, may be included in the molding compound. In some embodiments, the encapsulant 3 and the interlayer 2 are made of different materials. The encapsulant 3 may have a relatively high modulus (e.g., elastic modulus) than the interlayer 2. In some embodiments, the encapsulant 3 may have a relatively low coefficient of thermal expansion (CTE) than the interlayer. For example, the encapsulant 3 may have a CTE in a range from 15 ppm/° C. or above to 50 ppm/° C. or below (e.g., 15 ppm/° C., 20 ppm/° C., 25 ppm/° C., 30 ppm/° C., 35 ppm/° C., 40 ppm/° C., 45 ppm/° C. or 50 ppm/° C.). The interlayer 2 may have a CTE in a range from 50 ppm/° C. or above to 150 ppm/° C. or below (e.g., 50 ppm/° C., 60 ppm/° C., 70 ppm/° C., 80 ppm/° C., 90 ppm/° C., 100 ppm/° C., 110 ppm/° C., 120 ppm/° C., 130 ppm/° C., 140 ppm/° C. or 150 ppm/° C.). In some embodiments, the encapsulant 3 may have a relatively high glass transition temperature (Tg) than the interlayer. For example, the encapsulant 3 may have a Tg in a range from 100° C. or above to 180° C. or below (e.g., 100° C., 105° C., 110° C., 120° C., 130° C., 140° C., 150° C., 160° C., 170° C. or 180° C.). The interlayer 2 may have a Tg in a range from 50° C. or above to 100° C. or below (e.g., 50° C., 60° C., 70° C., 75° C., 80° C., 90° C. or 100° C.).

Figure 2:
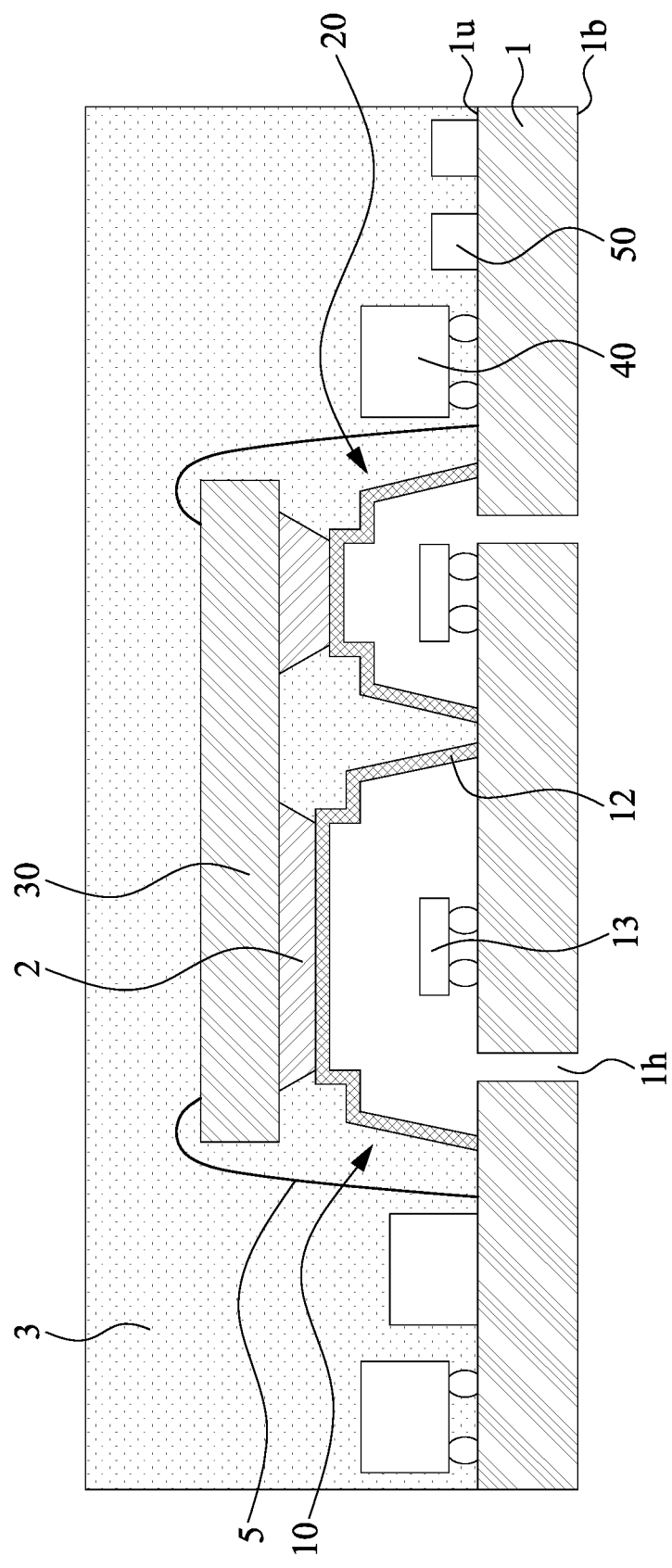
FIG. 2 illustrates a three-dimensional view of a semiconductor package structure according to some embodiments of the present disclosure.

FIG. 2 illustrates a three-dimensional view of a semiconductor package structure 200 according to some embodiments of the present disclosure. The semiconductor package structure 200 of FIG. 2 has a similar structure to that of the semiconductor package structure 100 of FIG. 1A, except for the structure of the first electronic component 10, the second electronic component 20, and the substrate 1. Furthermore, the semiconductor package structure 200 may include other electronic components (e.g., 40, 50) disposed on the upper surface 1u of the substrate 1.

In some embodiments, the first electronic component 10 or the second electronic component 20 may be a sensing component or a MEMS device. As illustrated in FIG. 2, the first electronic component 10 or the second electronic component 20 may include one or more component 13 and a lid 12. The one or more component 13 may be disclosed on the upper surface 1u of the substrate 1. The one or more component 13 may be a die. The one or more component 13 may be electrically connected to the substrate 1. The lid 12 is disposed on the upper surface 1u of the substrate 1 and defines, together with the substrate 1, a cavity to accommodate the one or more component 13. In some embodiments, the lid 12 encloses the one or more component 13. The substrate 1 may include a penetration hole 1h to communicate the cavity with the external environment. In some embodiments, the lid 12 is a metal lid. The lid 12 may include, for example, cobalt, aluminum, copper, chromium, tin, gold, silver, nickel, iron, or stainless steel, or a mixture, an alloy, or other combination thereof. The edges of the upper surface of the first electronic component 10 and the upper surface of the second electronic component 20 may be defined by the lid 12.

Figure 3:
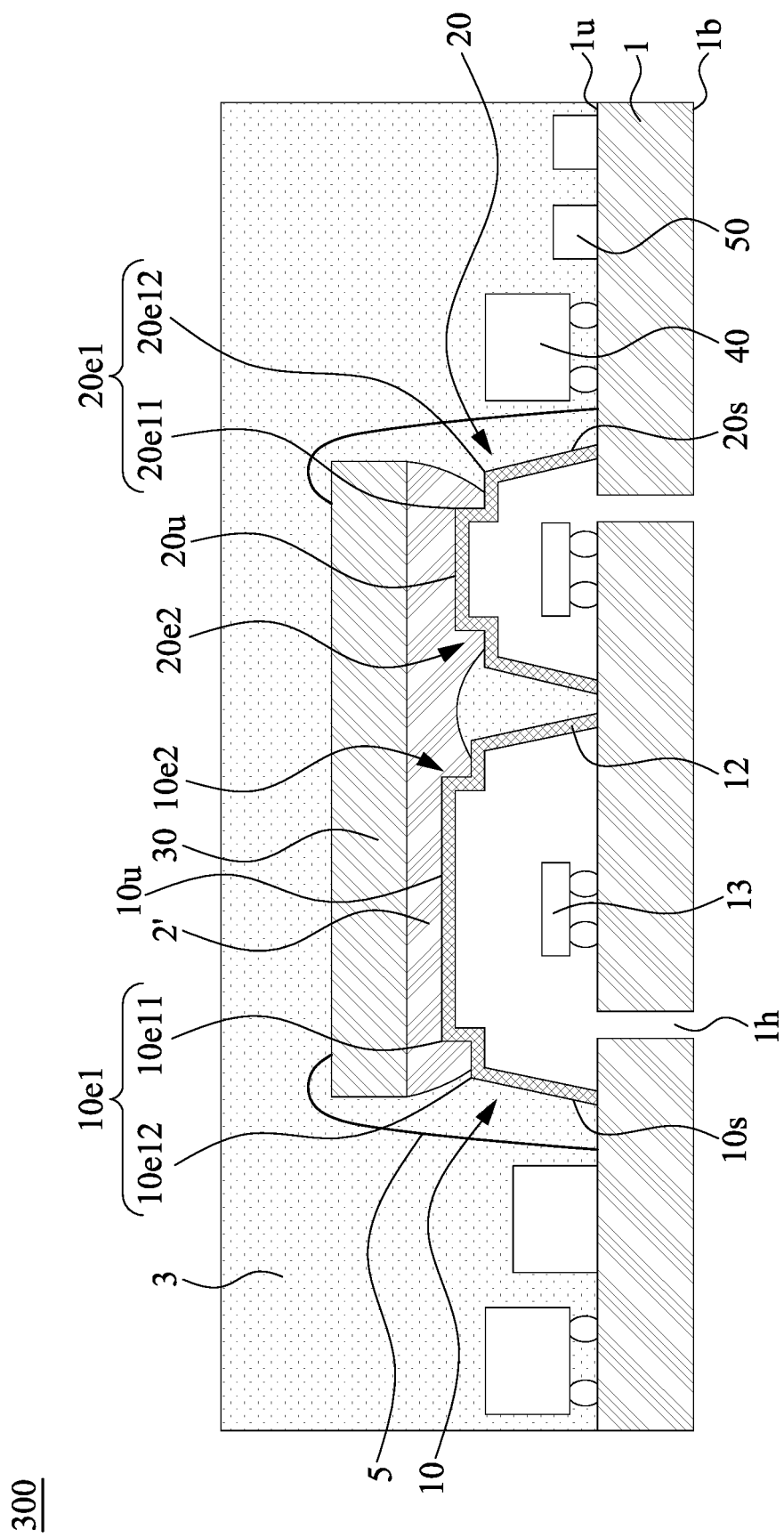
FIG. 3 illustrates a three-dimensional view of a semiconductor package structure according to some embodiments of the present disclosure.

FIG. 3 illustrates a three-dimensional view of a semiconductor package structure 300 according to some embodiments of the present disclosure. The semiconductor package structure 300 of FIG. 3 has a similar structure to that of the semiconductor package structure 200 of FIG. 2, except for the interlayer 2'.

In some embodiments as illustrated in FIG. 3, the interlayer 2' is a continuous layer covering the upper surface 10u of the first electronic component 10 and the upper surface 20u of the second electronic component 20.

Similar to the interlayer 2, the interlayer 2' does not contact the lateral surface 10s of the first electronic component 10 and the lateral surface 20s of the second electronic component 20. Thus, the lateral surface 10s of the first electronic component 10 and the lateral surface 20s of the second electronic component 20 are in contact with the encapsulant 3, rather than the interlayer 2'. In some embodiments, the interlayer 2' may be disposed on the edge (e.g., 10e1, 20e1) but does not contact the second sub-edge (e.g., 10e12, 20e12) connected to the lateral surface (e.g., 10s, 20s) of the first electronic component 10 or the second electronic component 20.

The interlayer 2' may extend over the upper surface 10u of the first electronic component 10 and the upper surface 20u of the second electronic component 20. In some embodiments, the interlayer 2' may contact the first edge 10e1 of the upper surface 10u of the first electronic component 10 and the first edge 20e1 of the upper surface 20u of the second electronic component 20, but does not extend beyond the first edge 10e1 of the upper surface 10u of the first electronic component 10 and the first edge 20e1 of the upper surface 20u of the second electronic component 20. In some embodiments, the interlayer 2' may have an end spaced from the second sub-edge 10e12 of the first edge 10e1 of the upper surface 10u of the first electronic component 10. In some embodiments, the interlayer 2' may have an end spaced from the second sub-edge 20e12 of the first edge 20e1 of the upper surface 20u of the second electronic component 20. In some embodiments, the interlayer 2' does not contact a lateral surface of the third electronic component 30.

In some embodiments, the interlayer 2' may be any suitable adhesive tape or film. In some embodiments, the interlayer 2' may be die-attach-film (DAF) or film-over-wire (FOW).

Figure 4:
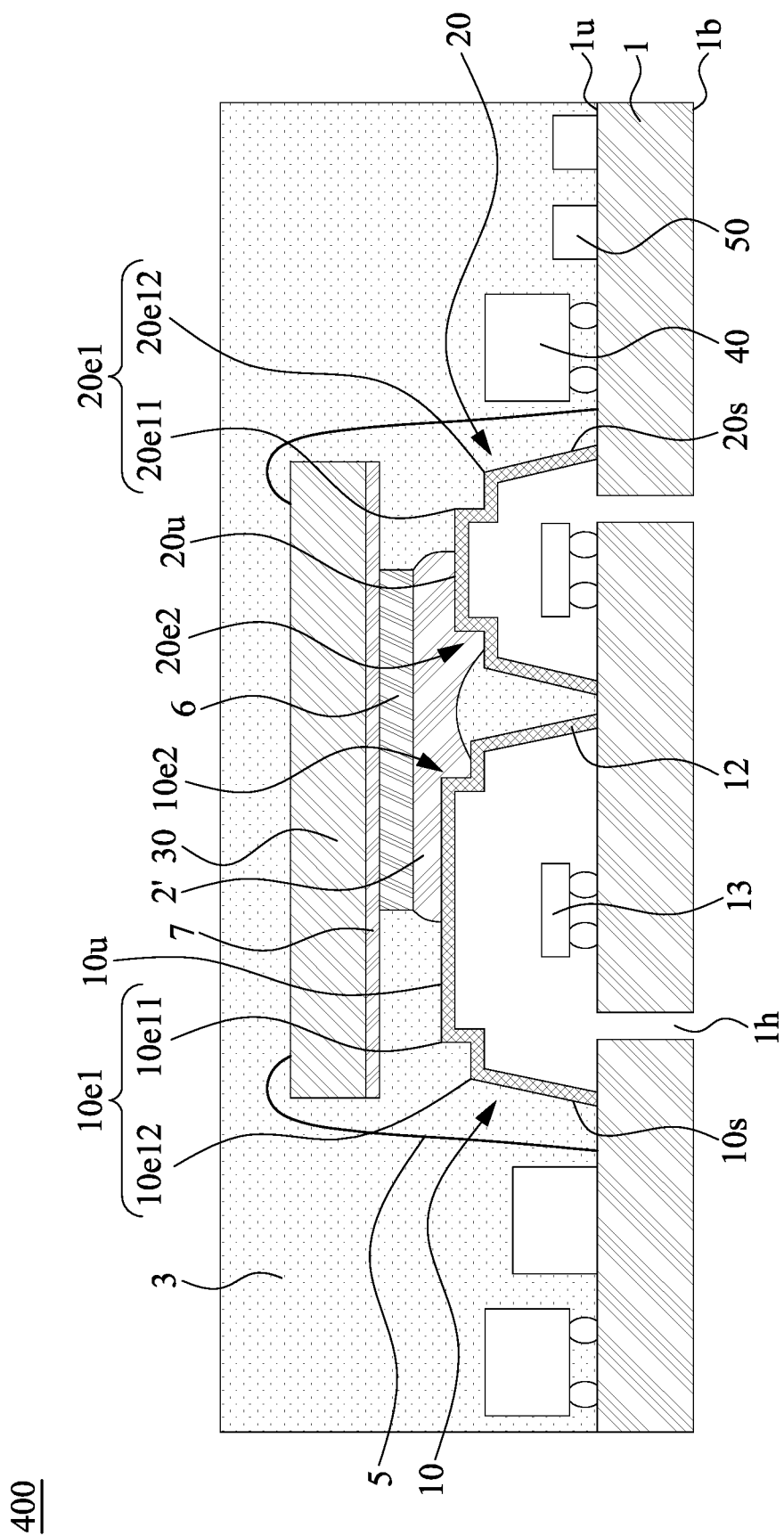
FIG. 4 illustrates a three-dimensional view of a semiconductor package structure according to some embodiments of the present disclosure.

FIG. 4 illustrates a three-dimensional view of a semiconductor package structure 400 according to some embodiments of the present disclosure. The semiconductor package structure 400 of FIG. 4 has a similar structure to that of the semiconductor package structure 300 of FIG. 3, except for the spacer 6.

In some embodiments as illustrated in FIG. 4, the semiconductor package structure 400 further includes a spacer 6 between the interlayer 2' and the third electronic component 30. In some embodiments, the spacer 6 may be attached to the third electronic component 30 via an adhesive 7. The adhesive 7 may be any suitable adhesive tape or film. The spacer 6 may function as a buffer layer. With the use of the spacer 6, the thickness of the interlayer 2' can be reduced.

In some embodiments as illustrated in FIG. 4, the interlayer 2' may have an end spaced from the first sub-edge 10e11 of the first edge 10e1 of the upper surface 10u of the first electronic component 10. In addition, the interlayer 2' may have an end spaced from the first sub-edge 20e11 of the first edge 20e1 of the upper surface 20u of the second electronic component 20.

Figure 5:
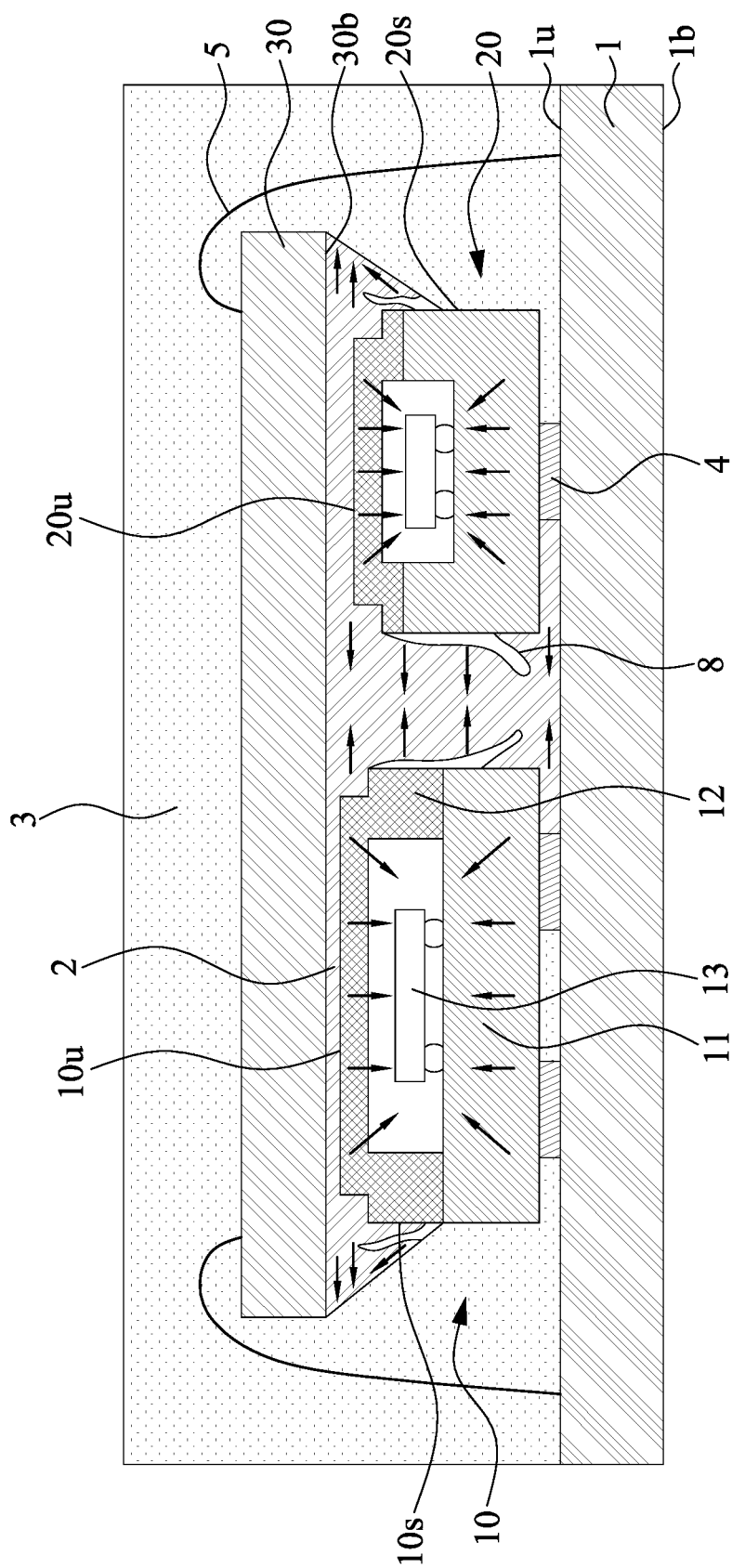
FIG. 5 illustrates a three-dimensional view of a semiconductor package structure according to some embodiments of the present disclosure.

FIG. 5 illustrates a three-dimensional view of a semiconductor package structure 500 according to an comparative embodiment of the present disclosure. The semiconductor package structure 500 of FIG. 5 has a similar structure to that of the semiconductor package structure 100 of FIG. 1, except the interlayer 2.

As illustrated in FIG. 5, the interlayer 2 is disposed on the upper surface 10u of the first electronic component 10 and the upper surface 20u of the second electronic component 20, extends beyond the first edge 10e1 of the upper surface 10u of the first electronic component 10 and the first edge 20e1 of the upper surface 20u of the second electronic component 20, and contacts the lateral surface 10s of the first electronic component 10 and the lateral surface 20s of the second electronic component 20.

In the comparative embodiment illustrated in FIG. 5, delamination or cracks 8 are found at a position near the interface between the interlayer 2 and the first/second electronic components 10 or 20 after the formation of the encapsulant 3. Without being bound by theory, the inventors found that this may because the molding compound has a higher modulus than the interlayer 2 and the adhesion of the molding compound to the interlayer 2 is higher than the adhesion of the interlayer 2 to the components. In addition, the interlayer 2 has a higher CTE than the molding compound. When the temperature is dropped after the formation of the encapsulant 3, the first/second electronic components 10 or 20 may contract and the interlayer 2 may be dragged by the molding compound, and as a result, delamination or cracks are formed. In addition, in a position between the first electronic component 10 and the second electronic component 20, delamination or cracks are also found which may due to the contraction of the first electronic component 10 and the second electronic component 20 and the contraction of the interlayer 2. As compared to the comparative embodiment, it has been surprisingly found that in the embodiments according to the present disclosure, by restricting the amount or distribution of the interlayer 2 so that the interlayer 2 does not contact the lateral surface of the first electronic components or does not extend beyond an edge of the upper surface of the first electronic component, the delamination or crack issue can be greatly improved.

Further, in the comparative embodiment illustrated in FIG. 5, the upper surface 10u of the first electronic component 10 is not coplanar with the upper surface 20u of the second electronic component 20. To reduce the tilting of the third electronic component 30 and enhance the adhesion among the first electronic component 10, the second electronic component 20 and the third electronic component 30, it is expected that a larger amount of adhesive should be used. However, as stated above, the delamination or cracks 8 are found at a position near the interface between the interlayer 2 and the first/second electronic components 10 or 20 after the formation of the encapsulant 3. It has been surprisingly found that the present disclosure can greatly improve the delamination or crack issue while maintaining good adhesion among the first electronic component 10, the second electronic component 20 and the third electronic component 30.

FIG. 6A, FIG. 6B, FIG. 6C, FIG. 6D, FIG. 6E and FIG. 6F illustrate various stages of a method for manufacturing a semiconductor package structure 200 in accordance with some embodiments of the present disclosure.

Figure 6A:
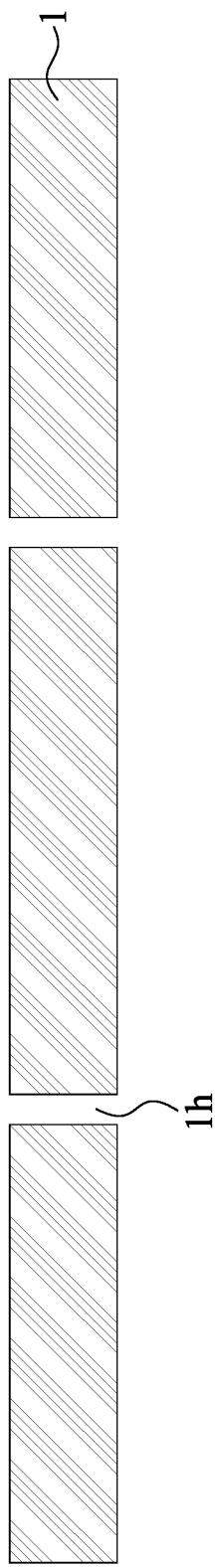
FIG. 6A, FIG. 6B, FIG. 6C, FIG. 6D, FIG. 6E and FIG. 6F illustrate various stages of a method for manufacturing a semiconductor package structure in accordance with some embodiments of the present disclosure.

Referring to FIG. 6A, a substrate 1 with a penetration hole 1h is provided.

Figure 6B:
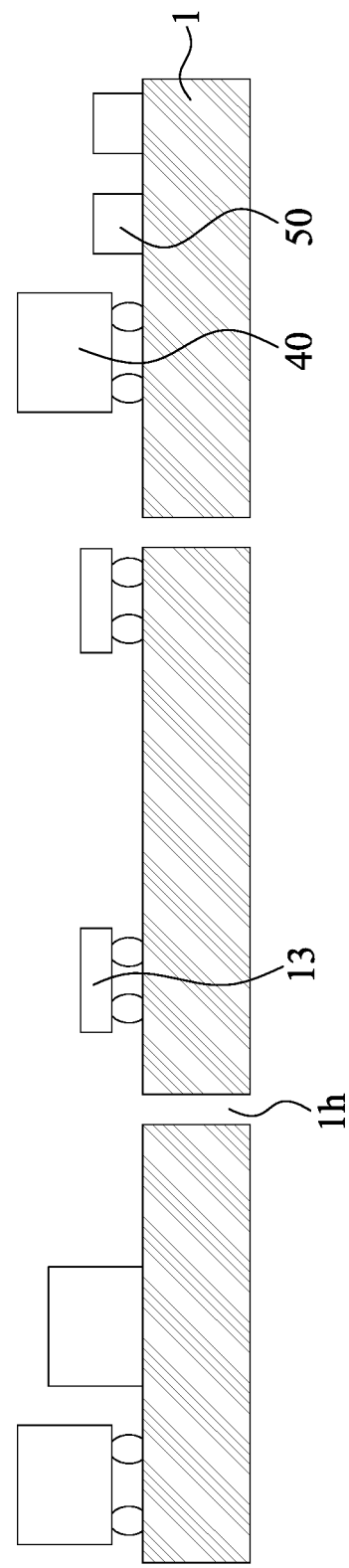

Referring to FIG. 6B, the electronic components 13, 40 and 50 are disposed on the substrate 1 and may be electrically connected to the substrate 1.

Figure 6C:
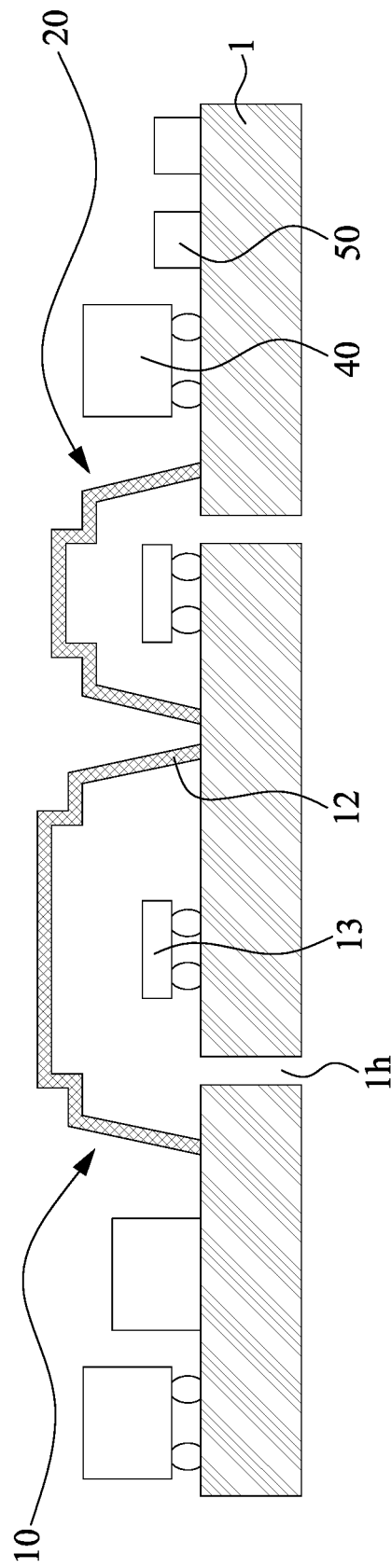

Referring to FIG. 6C, the lid 12 is disposed on the substrate 1 to enclose the electronic component 13. As a result, the electronic components 10 and 20 are formed. The upper surface of the electronic component 10 is at a higher elevation than the upper surface of the electronic component 20.

Figure 6D:
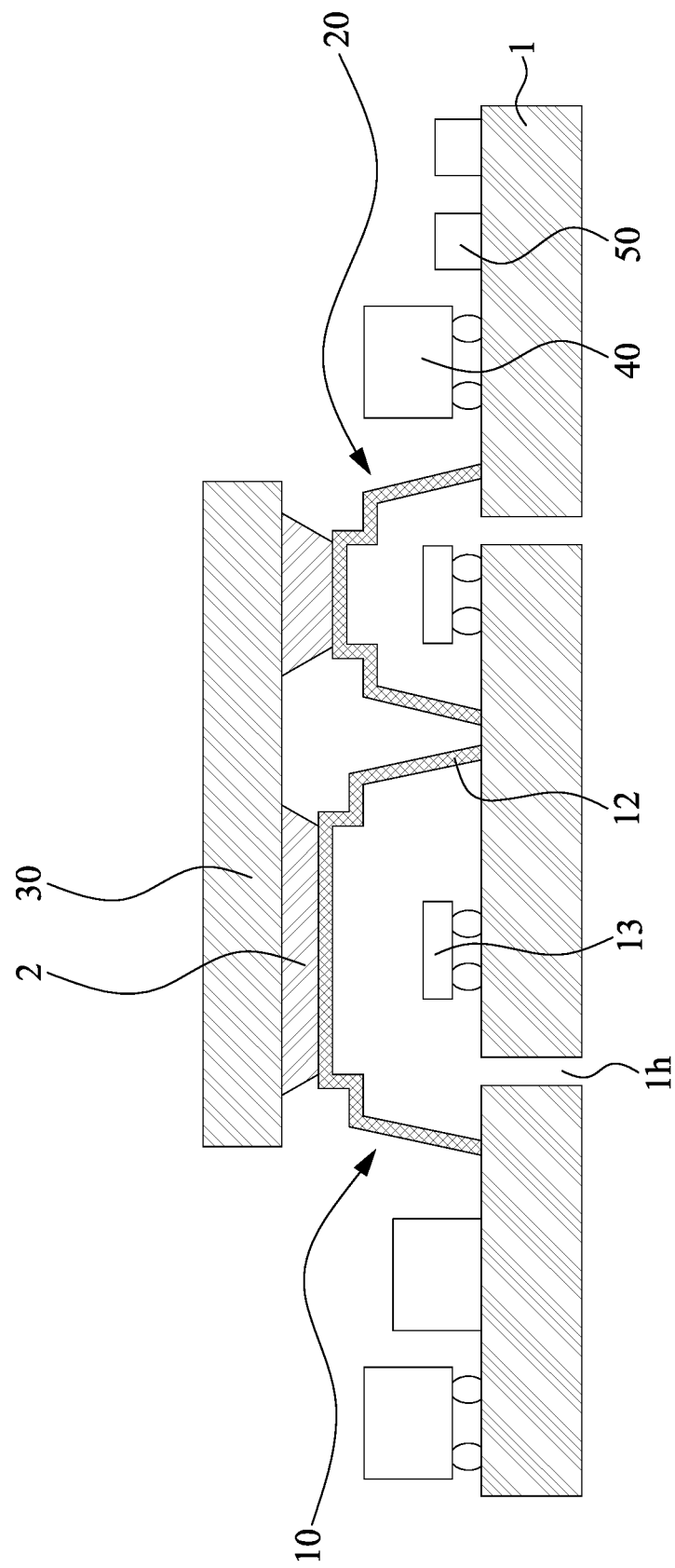

Referring to FIG. 6D, an electronic component 30 is attached to the upper surface of the electronic component 10 and the upper surface of the electronic component 20 via an interlayer 2. The adhesive, such as an underfill material or a mold underfill material (MUF), can be applied onto the upper surface of the electronic component 10 and the upper surface of the electronic component 20 or the lower surface of the electronic component 30 before the attachment to form the interlayer 2. The interlayer 2 may be cured in a subsequent process.

Figure 6E:
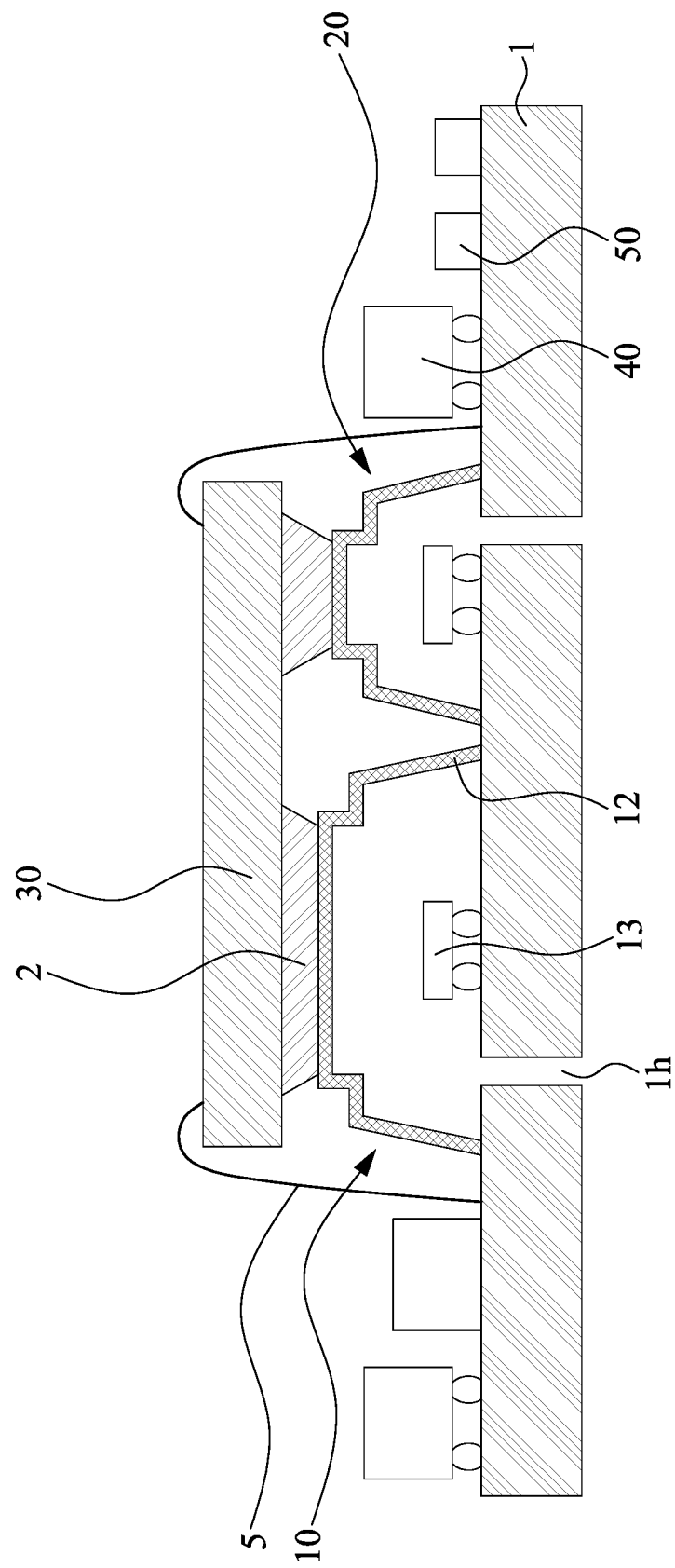

Referring to FIG. 6E, the electronic component 30 is electrically connected to the substrate 1, e.g., via a wire 5.

Figure 6F:
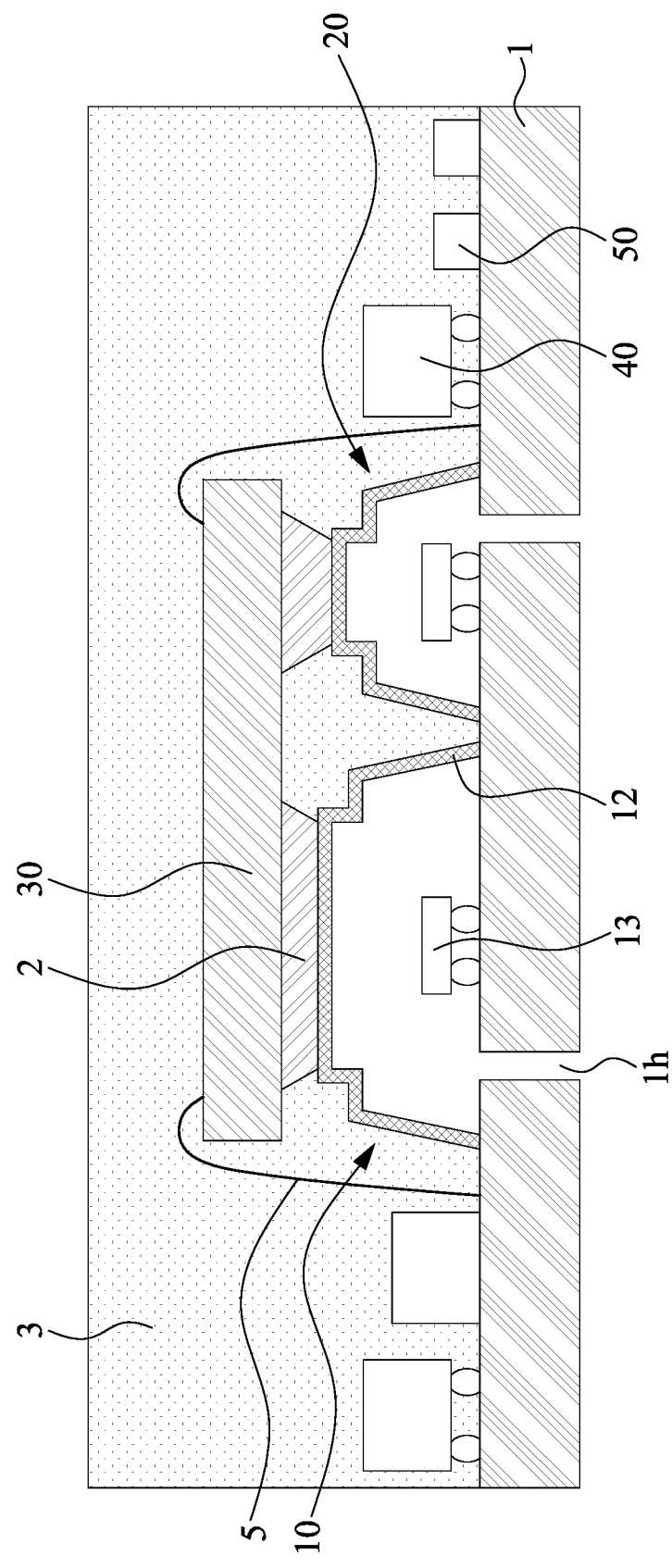

Referring to FIG. 6F, the encapsulant 3 is disposed on the substrate 1 to cover the electronic components 10, 20, 30, 40 and 50 and the wire 5. A semiconductor package structure 200 is formed and the interlayer 2 does not contact a lateral surface of the electronic component 10 and a lateral surface of the electronic component 20.

FIG. 7A, FIG. 7B, FIG. 7C and FIG. 7D illustrate various stages of a method for manufacturing a semiconductor package structure 300 in accordance with some embodiments of the present disclosure.

Figure 7A:
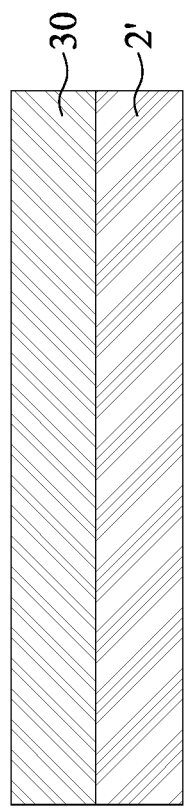
FIG. 7A, FIG. 7B, FIG. 7C and FIG. 7D illustrate various stages of a method for manufacturing a semiconductor package structure in accordance with some embodiments of the present disclosure.

Referring to FIG. 7A, an electronic component 30 is provided and an adhesive tape or film (e.g., FOW) is applied onto a lower surface of the electronic component 30 to form the interlayer 2'. The interlayer 2' may be cured in a subsequent process.

Figure 7B:
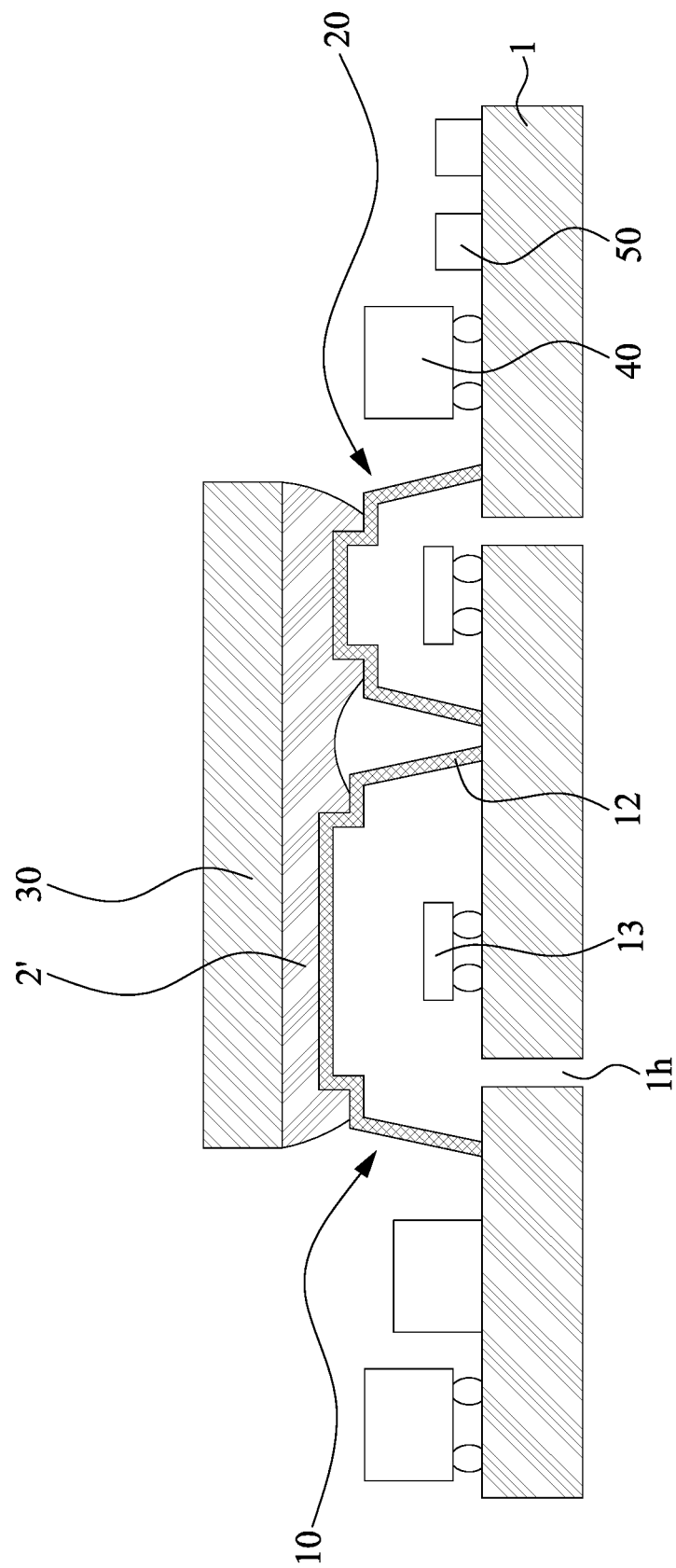

Referring to FIG. 7B, the structure of FIG. 6C is provided. The electronic component 30 is disposed on the upper surface of the electronic component 10 and the upper surface of the electronic component 20 such that the interlayer 2' contacts the upper surface of the electronic component 10 and the upper surface of the electronic component 20.

Figure 7C:
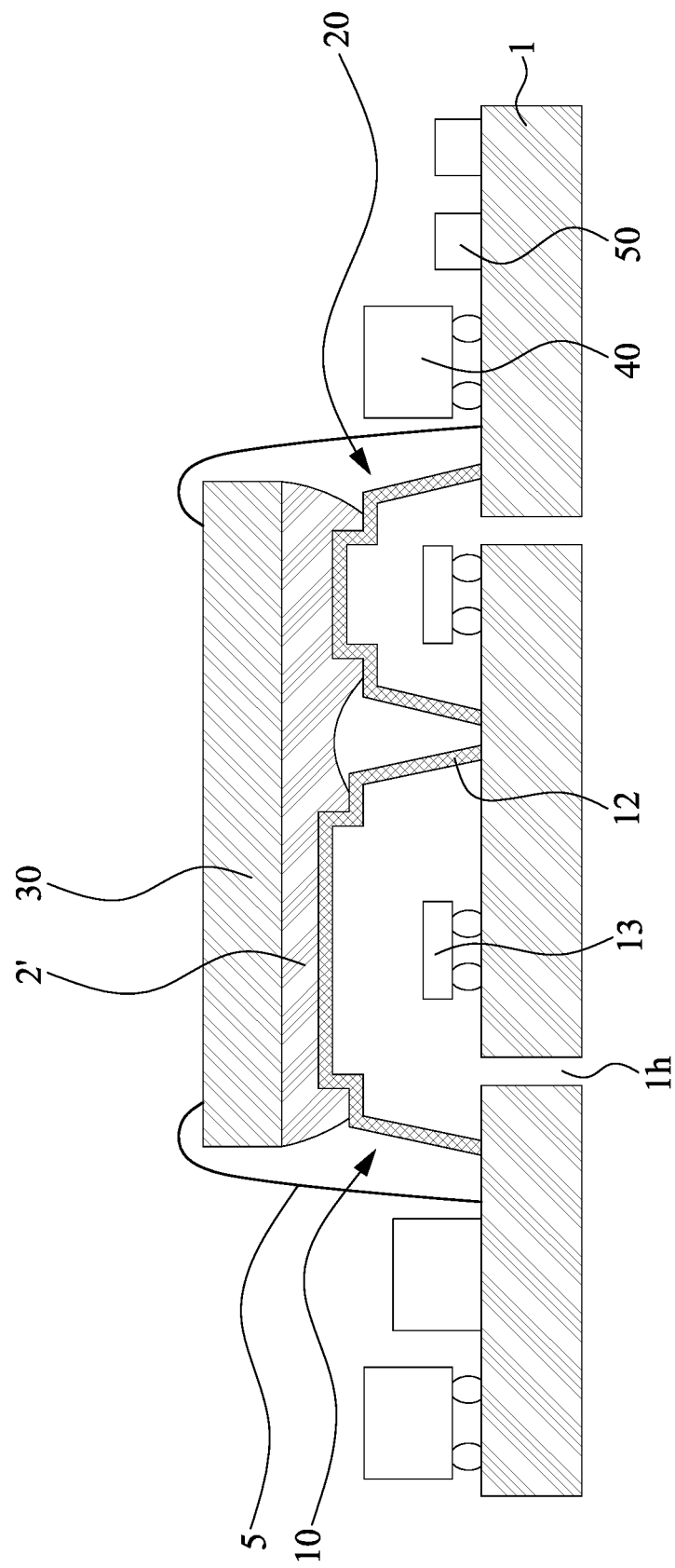

Referring to FIG. 7C, the electronic component 30 is electrically connected to the substrate 1, e.g., via a wire 5.

Figure 7D:
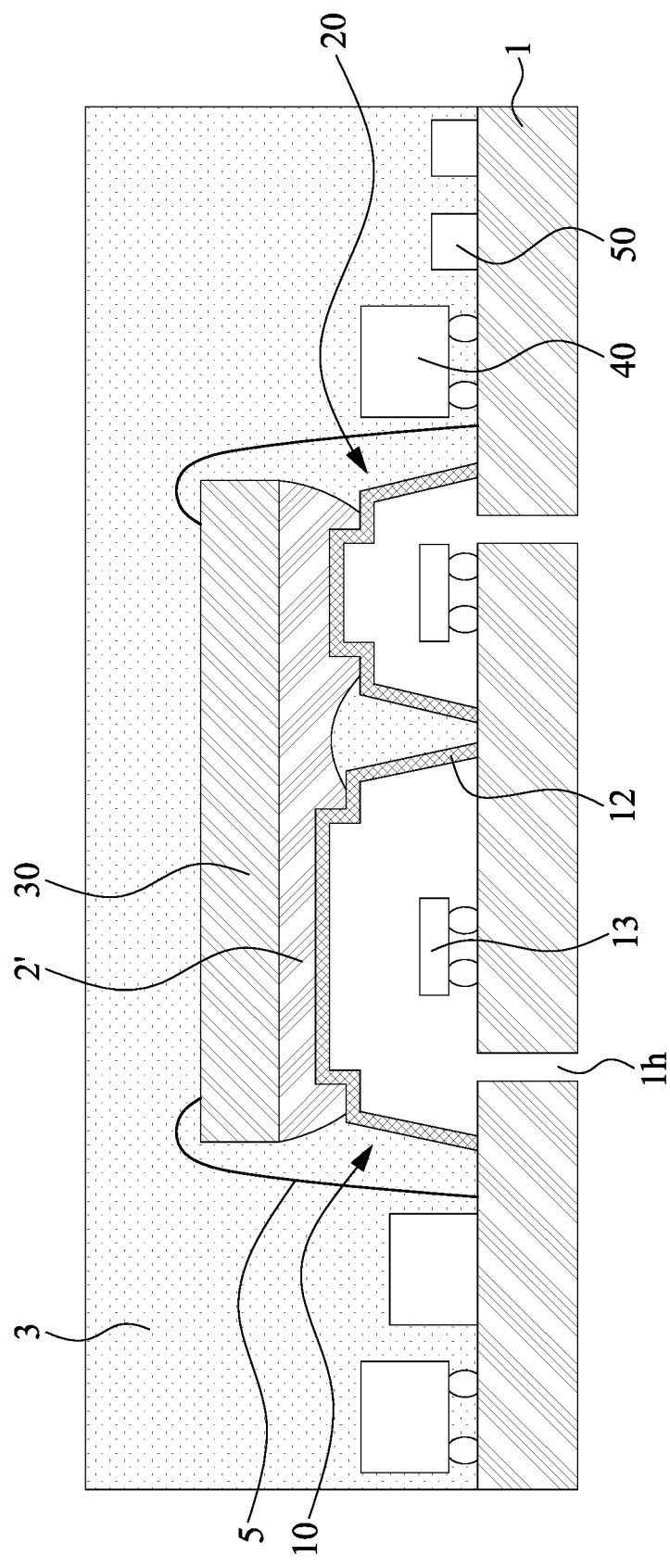

Referring to FIG. 7D, the encapsulant 3 is disposed on the substrate 1 to cover the electronic components 10, 20, 30, 40 and 50 and the wire 5. A semiconductor package structure 300 is formed and the interlayer 2' does not contact a lateral surface of the electronic component 10 and a lateral surface of the electronic component 20.

FIG. 8A, FIG. 8B, FIG. 8C and FIG. 8D illustrate various stages of a method for manufacturing a semiconductor package structure 400 in accordance with some embodiments of the present disclosure.

Figure 8A:
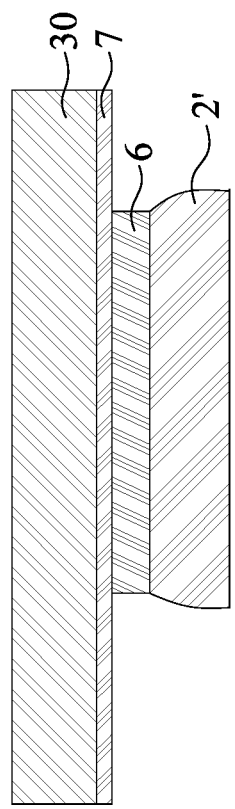
FIG. 8A, FIG. 8B, FIG. 8C and FIG. 8D illustrate various stages of a method for manufacturing a semiconductor package structure in accordance with some embodiments of the present disclosure.

Referring to FIG. 8A, an electronic component 30 is provided. A spacer 6 is attached to the lower surface of the electronic component 30 via an adhesive 7. The adhesive 7 may be any suitable adhesive tape or film. A adhesive tape or film (e.g, FOW) is applied and cover the lower surface of the spacer 6 to form an interlayer 2'. The interlayer 2' may be cured in a subsequent process.

Figure 8B:
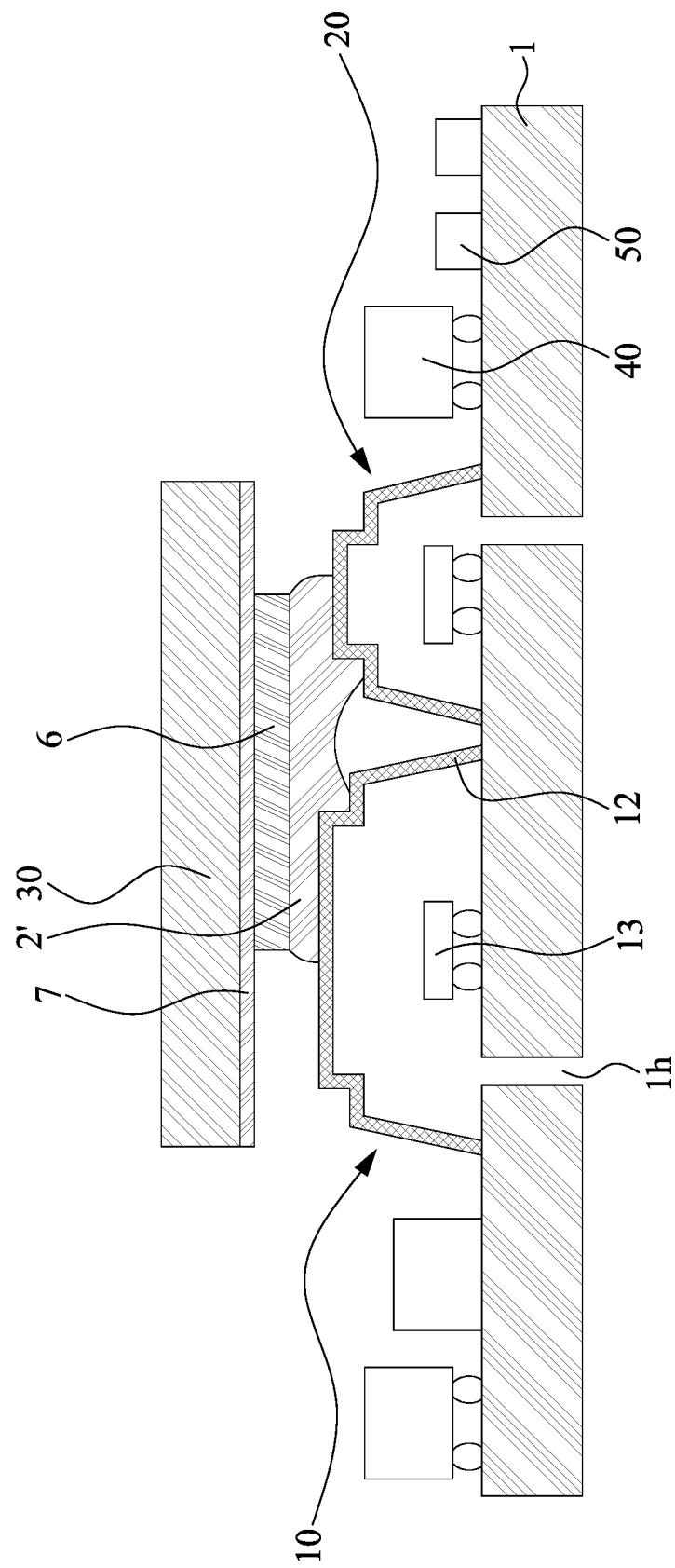

Referring to FIG. 8B, the structure of FIG. 6C is provided. The third electronic component 30 is disposed on the upper surface of the electronic component 10 and the upper surface of the electronic component 20 such that the interlayer 2' contacts the upper surface of the electronic component 10 and the upper surface of the electronic component 20.

Figure 8C:
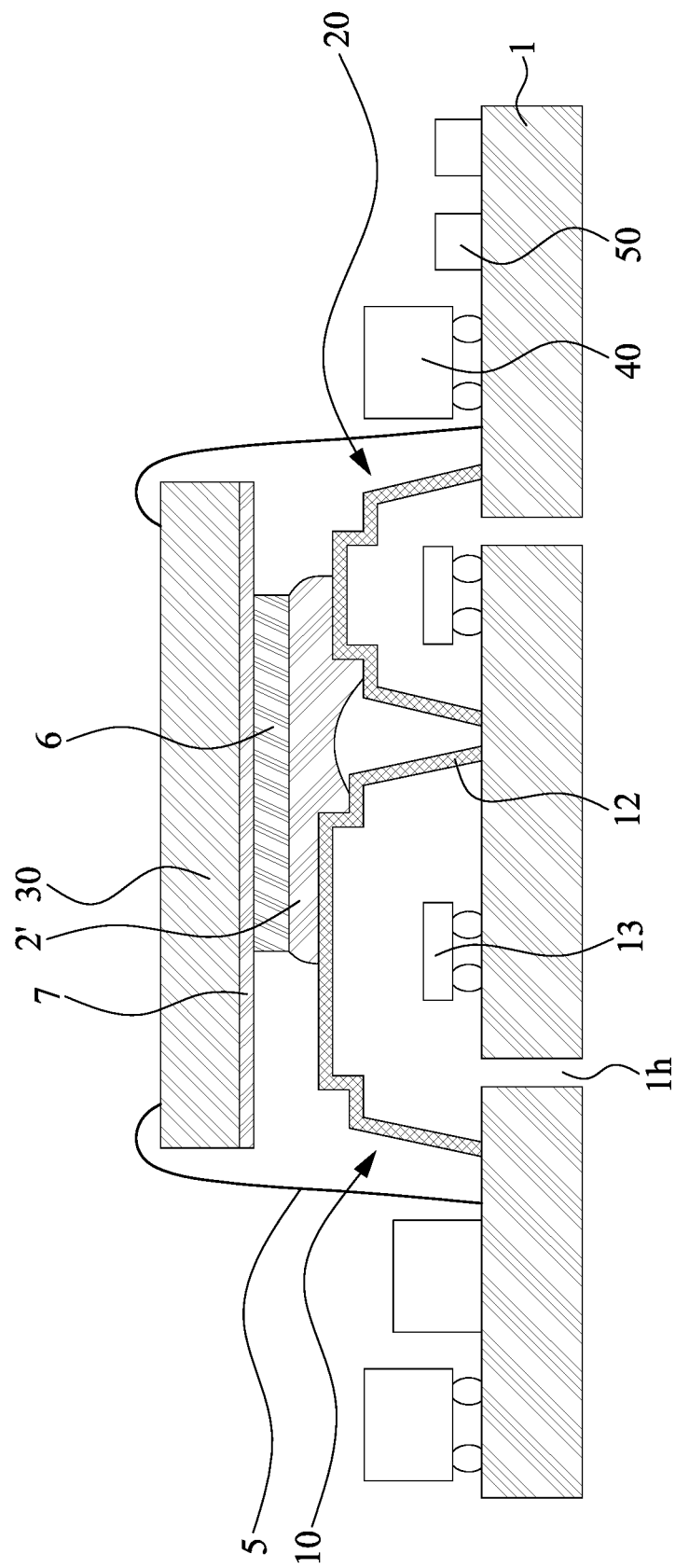

Referring to FIG. 8C, the electronic component 30 is electrically connected to the substrate 1, e.g., via a wire 5.

Figure 8D:
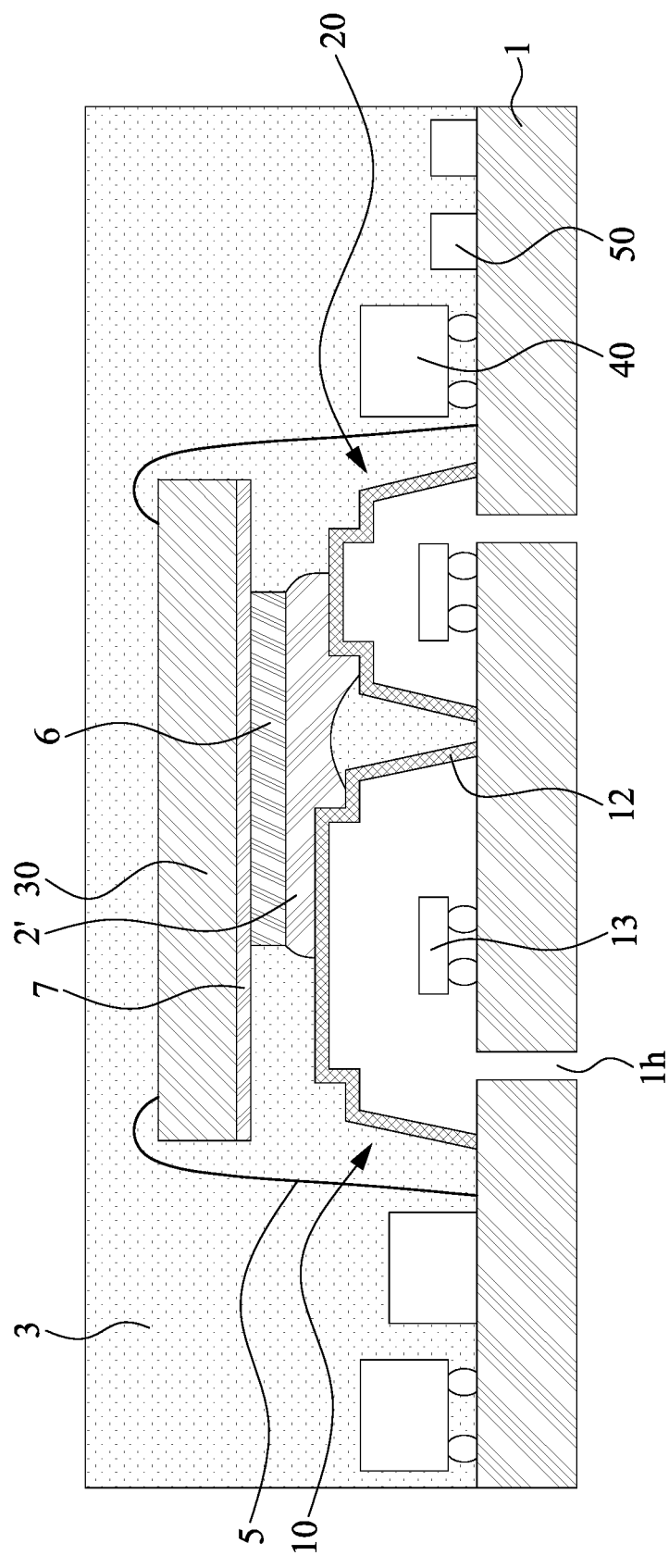

Referring to FIG. 8D, the encapsulant 3 is disposed on the substrate 1 to cover the electronic components 10, 20, 30, 40 and 50 and the wire 5. A semiconductor package structure 400 is formed and the interlayer 2' does not contact a lateral surface of the electronic component 10 and a lateral surface of the electronic component 20.

Although the above figures illustrate the methods for manufacturing a semiconductor package structures 200, 300 and 400, the semiconductor package structure 100 or other semiconductor package structures according to the present invention can be manufactured similarly.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between the highest point and the lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
a substrate;
a first electronic component disposed on the substrate, wherein the first electronic component has an upper surface and a lateral surface and a first edge between the upper surface and the lateral surface;
an interlayer on the upper surface of the first electronic component;
a third electronic component attached to the upper surface of the first electronic component via the interlayer; and
an encapsulant encapsulating the first electronic component and the interlayer;
wherein the interlayer does not contact the lateral surface of the first electronic component,
wherein the first edge of the first electronic component is a first recessed edge.

2. The semiconductor package structure of claim 1, wherein the first recessed edge comprises a first sub-edge connected to the upper surface and a second sub-edge connected to the lateral surface, and wherein the interlayer does not contact the second sub-edge of the first recessed edge.

3. The semiconductor package structure of claim 2, wherein the interlayer does not contact the first sub-edge of the first recessed edge.

4. The semiconductor package structure of claim 2, further comprising a second electronic component under the third electronic component, wherein the second electronic component has an upper surface, a lateral surface, and a second recessed edge between the upper surface and the lateral surface, wherein the second recessed edge includes a first sub-edge connected to the upper surface and a second sub-edge connected to the lateral surface, and wherein elevations of the first sub-edge and the second sub-edge of the second recessed edge of the second electronic component are different from elevations of the first sub-edge and the second sub-edge of the first recessed edge of the first electronic component.

5. The semiconductor package structure of claim 1, further comprising a second electronic component, wherein the first electronic component and the second electronic component are arranged side-by-side on the substrate, the interlayer is disposed on the upper surface of the first electronic component and an upper surface of the second electronic component, the third electronic component is attached to the upper surface of the first electronic component and the upper surface of the second electronic component via the interlayer, the encapsulant encapsulates the first electronic component, the second electronic component and the interlayer, and the interlayer does not contact the lateral surface of the first electronic component and a lateral surface of the second electronic component.

6. The semiconductor package structure of claim 5, wherein the upper surface of the first electronic component is at a higher elevation than the upper surface of the second electronic component.

7. The semiconductor package structure of claim 5, wherein the interlayer is disposed on the upper surface of the first electronic component and the upper surface of the second electronic component separately.

8. The semiconductor package structure of claim 7, wherein a thickness of the interlayer on the upper surface of the first electronic component is less than-a thickness of the interlayer on the upper surface of the second electronic component.

9. The semiconductor package structure of claim 1, wherein the third electronic component is an ASIC die.

10. The semiconductor package structure of claim 1, wherein the first electronic component comprises a MEMS device.

11. The semiconductor package structure of claim 1, wherein the encapsulant contacts the first electronic component and the interlayer.

12. The semiconductor package structure of claim 1, wherein the interlayer is an adhesive tape or film.

13. A semiconductor package structure, comprising:
a substrate;
a first electronic component disposed on the substrate, wherein the first electronic component has an upper surface and a lateral surface and a first edge between the upper surface and the lateral surface;
an interlayer on the upper surface of the first electronic component;
a second electronic component
a third electronic component attached to the upper surface of the first electronic component via the interlayer; and
an encapsulant encapsulating the first electronic component and the interlayer;
wherein the interlayer does not contact the lateral surface of the first electronic component,
wherein the first electronic component and the second electronic component are arranged side-by-side on the substrate, the third electronic component is attached to the upper surface of the first electronic component and an upper surface of the second electronic component via the interlayer, the encapsulant encapsulates the first electronic component, the second electronic component and the interlayer, the first edge of the upper surface of the first electronic component is away from the second electronic component, and the upper surface of the second electronic component has a first edge away from the first electronic component, and the interlayer does not extend beyond the first edge of the upper surface of the first electronic component and the first edge of the upper surface of the second electronic component, and wherein the first edge of the upper surface of the first electronic component, the first edge of the upper surface of the second electronic component, or both are a coved edge or a stepped edge.

* * * * *